United States Patent [19]
Jairazbhoy et al.

[11] Patent Number: 5,936,846
[45] Date of Patent: Aug. 10, 1999

[54] OPTIMIZED SOLDER JOINTS AND LIFTER PADS FOR IMPROVING THE SOLDER JOINT LIFE OF SURFACE MOUNT CHIPS

[75] Inventors: Vivek Amir Jairazbhoy, Farmington Hills; Richard Keith McMillan, II, Dearborn; Yi-Hsin Pao, Livonia, all of Mich.

[73] Assignee: Ford Global Technologies, Dearborn, Mich.

[21] Appl. No.: 08/786,389

[22] Filed: Jan. 16, 1997

[51] Int. Cl.⁶ .................................. H05K 1/14; H05K 1/16
[52] U.S. Cl. ...................... 361/770; 174/260; 174/138 G; 361/760; 361/767; 361/771
[58] Field of Search ...................................... 174/260, 261, 174/263, 138 G; 228/180.21, 180.22; 257/723, 724, 725, 778, 779; 361/760, 767, 768, 772, 773, 774, 779, 782, 783, 820, 770, 771; 439/68, 71, 83, 366; 438/118, 119

[56] References Cited

U.S. PATENT DOCUMENTS

| | | | |
|---|---|---|---|
| 4,749,120 | 6/1988 | Hatada | 228/180.22 |
| 4,760,948 | 8/1988 | Spiecker | 228/180.22 |
| 4,830,264 | 5/1989 | Bitaillou et al. | 228/180.21 |
| 5,051,339 | 9/1991 | Friedrich et al. | . |
| 5,311,402 | 5/1994 | Kobayashi et al. | 361/760 |
| 5,315,070 | 5/1994 | Maiwald | 174/261 |
| 5,400,950 | 3/1995 | Myers et al. | 228/180.22 |
| 5,450,283 | 9/1995 | Lin et al. | 361/704 |
| 5,684,677 | 11/1997 | Uchida et al. | 361/770 |
| 5,726,861 | 3/1998 | Ostrem | 361/767 |

FOREIGN PATENT DOCUMENTS

| | | |
|---|---|---|
| 35 36 431 | 4/1987 | Germany . |
| 3536431A1 | 4/1987 | Germany . |
| 4137045A1 | 5/1993 | Germany . |
| 4402545A1 | 8/1994 | Germany . |
| 1-251789 | 10/1989 | Japan . |
| 4-268786 | 9/1992 | Japan . |
| WO 93/23981 | 11/1993 | WIPO . |
| WO 96/20580 | 7/1996 | WIPO . |

*Primary Examiner*—Donald Sparks
*Attorney, Agent, or Firm*—Leslie C. Hodges

[57] ABSTRACT

There is disclosed herein a surface mount printed circuit board having a substrate, at least one surface mount device, at least two mounting pads per device, solder joints connecting the terminations of the device to their respective mounting pads, at least one rectangular lifter pad on the substrate amid the mounting pads, and a solder mass on each lifter pad in contact with the bottom surface of the device. The inner and outer extensions of the mounting pads, the size, number, and shape of the lifter pads, and the amounts of solder deposited on the mounting and lifter pads are designed such that the solder joint has preferably convex outer fillets, the device is maintained at a predetermined height above the mounting pads, the inner fillet angle is maintained above a predetermined minimum angle to increase solder joint crack initiation time, and the overall solder joint crack propagation length is increased. An alternate embodiment also includes plugged vias under the lifter pads and/or mounting pads, with gas pockets trapped between the solder masses/solder joints and the plugged vias. This trapped gas pocket provides additional buoyant force upon the SMD during reflow.

21 Claims, 5 Drawing Sheets

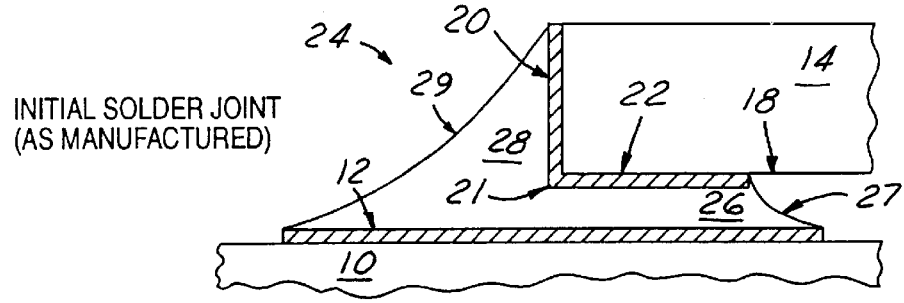
FIG. 1A  INITIAL SOLDER JOINT (AS MANUFACTURED)
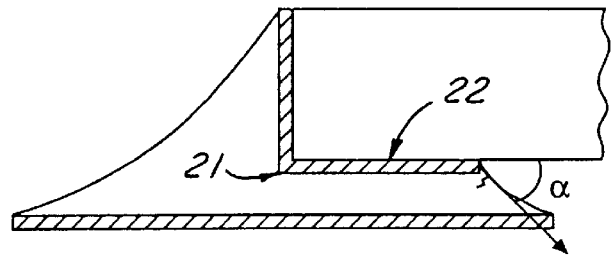
FIG. 1B  CRACK INITIATION
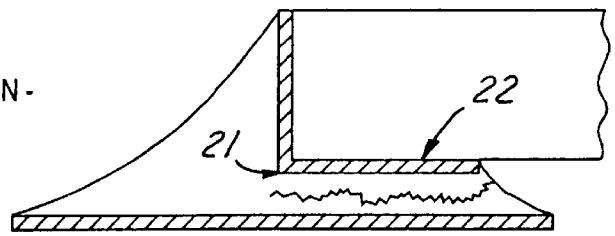
FIG. 1C  CRACK PROPAGATION - PHASE I
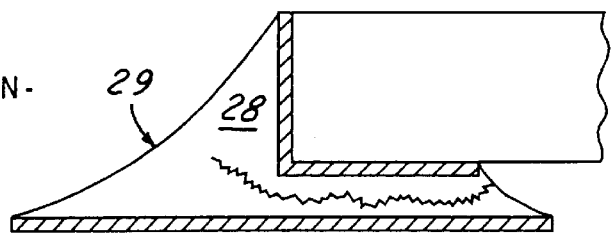
FIG. 1D  CRACK PROPAGATION - PHASE II
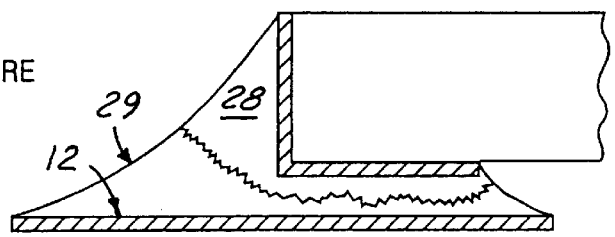
FIG. 1E  SOLDER JOINT FAILURE

OPTIMIZED SOLDER JOINTS AND LIFTER PADS FOR IMPROVING THE SOLDER JOINT LIFE OF SURFACE MOUNT CHIPS

BACKGROUND OF THE INVENTION

1. Field of the Invention

The present invention relates generally to printed circuit boards. More particularly, the present invention relates to printed circuit boards having surface mount devices with improved solder joints.

2. Disclosure Information

In the field of surface mount printed circuit boards (PCBs), an important indicator of solder joint durability is the time required for a solder joint of a surface mount device (SMD) to fail under given conditions of cyclic temperature variation. FIG. 1A shows a typical surface mount PCB having an SMD 14 joined to a mounting pad 12 on a PCB substrate 10 by a conventional solder joint 24. The solder joint 24 has an inner fillet 26 adjacent the device's bottom surface 18 and the mounting pad 12, and an outer fillet 28 extending between the device's perimeter wall 20 and the mounting pad 12. As FIG. 1A illustrates, conventional solder joint inner and outer fillets are concave in shape.

When a solder joint fails, two successive phases of joint failure occur: crack initiation and crack propagation. Crack initiation time is the time required for a crack to first form in the solder joint. As FIG. 1B illustrates, crack initiation generally begins on the inner fillet surface 27. Crack propagation time, on the other hand, is the time from crack initiation until the solder joint fails electrically. The propagation phase consists of two stages: propagation of the crack under the device end termination 22, as shown in FIG. 1C, and propagation in the outer fillet 28, as shown in FIG. 1D. Crack propagation in the outer fillet typically occurs along a line that makes a 45 degree angle with the horizontal extending from the bottom edge 21 of the device up to the outer surface 29 of the fillet. A solder joint fails electrically when the crack propagates to the outer fillet outer surface 29 or substantially thereto, as illustrated in FIG. 1E, such that electrical continuity is functionally broken between the termination 22 and its associated mounting pad 12.

It has been demonstrated that solder joint life is affected by three aspects of solder joint geometry: (1) solder joint height $h_o$, defined as the vertical distance between the device's bottom terminations and the vertically adjacent mounting pads, as shown in FIG. 1A; (2) solder joint inner fillet shape; and (3) solder joint outer fillet shape. Crack initiation time tends to increase with increased solder joint height $h_o$ and with appropriately designed inner fillet shape (i.e., with the inner fillet angle $\alpha$ being greater than a certain minimum number of degrees). Crack propagation time under the terminations (i.e., stage I) tends to increase with increased solder joint height. It also tends to increase with increased distance between the inner fillet surface 27 and the bottom edge 21 of the terminations; however, this distance is determined by the geometry of the device's terminations and is fixed for a given device. As for crack propagation time in the outer fillet (i.e., stage II), this tends to increase with appropriate outer fillet shape, particularly where the shape requires that the crack propagate a longer distance. Thus, overall solder joint life can be improved generally by increasing the solder joint height and by appropriately designing the shape of the inner and outer fillets.

One known method for increasing solder joint height is to include "lifter pads" 30 beneath the non-solderable bottom surface of the SMD, as shown in FIG. 2. According to the prior art, these lifter pads are round in shape. When a solder mass 32 deposited on a lifter pad melts during reflow soldering, pressure within the molten solder mass provides an upward force $F_L$ which tends to lift the component, ideally maintaining it at or above a minimum solder joint height $h_o$ until the solder mass returns to a solid state.

While this method does tend to increase solder joint height, it makes no provision for the effect of the lifter pad on solder joint geometry. As the component is lifted by the lifter pads, solder quantity at both the inner and outer fillet areas is decreased as solder flows under the device termination area to fill in the increased solder height, thereby detrimentally altering solder joint geometry. Similarly, surface tension and pressure forces within the solder joint fillets detrimentally affect the shape and lifting effectiveness of the molten solder masses atop the lifter pads. Thus, using conventional lifter pads methods, inner and outer solder joint fillets tend to change shape and decrease in size, while lifter pad effectiveness in increasing solder joint height is reduced due to the effect of surface tension and pressure forces acting at the solder joints. Thus, while overall solder joint height may be increased, decreased overall crack propagation length and unfavorable interior fillet angles $\alpha$ may result, such that little or no overall improvement in crack initiation and propagation time is achieved.

Another approach for increasing solder joint height is disclosed in "Prediction of Equilibrium Shapes and Pedestal Heights of Solder Joints for Leadless Chip Components" (IEEE Transactions on Components, Packaging, and Mfg. Tech.), illustrated in FIG. 3. Rather than using lifter pads, this approach utilizes mounting pads whose outer edge 15 is spaced closer to the SMD than is the case for conventional mounting pads, so as to encourage the formation of convex inner and outer fillets, rather than the typical concave fillets. According to this approach, an amount of solder is deposited on the mounting pads sufficient to "float" the device on the solder to a desired solder joint height when subsequently reflowed.

This approach can be further illustrated by referring to FIGS. 4 and 5. FIG. 4 shows a free body diagram of a conventionally soldered (i.e., concave solder joint) SMD and the forces acting thereon during and after reflow. A solder joint height $h_o$ is achieved when the net downward force on the SMD (i.e., the weight W of the device, the ambient pressure $P_a$, and the vertical components of the outer and inner fillet surface tension forces, $F_1$ and $F_2$, respectively) reaches equilibrium with the net upward force (i.e., the buoyancy and contact force $p_o$ provided by the solder joint). Compare this with FIG. 5, which shows a free body diagram of an SMD and the forces acting thereon during and after reflow, utilizing convex solder joints. Note that the vertical components of the surface tension forces $F_1$ and $F_2$ exert less downward force on the SMD than do the vertical components of $F_1$ and $F_2$ in FIG. 4. In addition, the convex shape in FIG. 5 guarantees that $P_o > P_a$ (i.e., a net upward pressure force), while in FIG. 4 the concave shape suggests that $p_a > p_o$ (i.e., a net downward pressure force), particularly for devices having relatively wide solder joints. Thus, by utilizing the convex joint geometry illustrated in FIG. 5, a greater solder height $h_o$ can be achieved than can be realized by using the conventional concave solder joint geometry.

However, in practice both of the above prior art methods are limited in their applicability by limits between design of the mounting or lifter pads and the quantity of solder which can be deposited thereon using the standard solder paste deposition process (i.e., screen printing). While other methods exist which can deposit additional solder paste (e.g., dispensing), these are generally much slower than screen printing and so are most practically employed at additional cost only when needed.

Furthermore, while both of these approaches may be effective in achieving a desired solder joint height, they unfortunately may have detrimental effects on solder joint life. For example, the prior art lifter pad method produces concave solder joints having a decreased distance between the inner fillet surface and the outer fillet surface (i.e., decreased overall crack propagation length). Also, while the prior art convex geometry method provides a solder joint height which would increase stage II crack propagation time somewhat, neither this method nor the prior art lifter pad method addresses how to appropriately design the inner fillet geometry, nor how to optimize the mounting pad design to maximize the outer fillet crack propagation distance.

It is desirable, therefore, to provide a method for improving solder joint durability by achieving increased solder joint height, optimized solder joint inner fillet shape, and optimized solder joint outer fillet size and shape.

SUMMARY OF THE INVENTION

The present invention overcomes the disadvantages of the prior art by providing a surface mount PCB having a substrate, at least one surface mount device, at least two mounting pads per device, solder joints connecting the terminations of the device to their respective mounting pads, at least one rectangular lifter pad on the substrate amid the mounting pads, and a solder mass on each lifter pad in contact with the bottom surface of the device. The inner and outer extensions of the mounting pads, the size, number, and shape of the lifter pads, and the amounts of solder deposited on the mounting and lifter pads are optimized such that the solder joint has preferably convex outer fillets, the device is maintained at a predetermined height above the mounting pads, the inner fillet angle is maintained above a predetermined minimum angle, and the overall solder joint crack propagation length is increased. An alternate embodiment also includes plugged vias under the lifter pads and/or mounting pads, with gas pockets trapped between the solder masses/solder joints and the plugged vias. This trapped gas pocket provides additional buoyant force upon the SMD during reflow.

It is an advantage of the present invention that the use of a minimum inner fillet angle, in conjunction with an increased solder joint height, promotes increased crack initiation time.

It is a further advantage that the optimized outer fillet shape of the present invention, in conjunction with an increased solder joint height, promotes increased crack propagation time.

Another advantage of the present invention is that the rectangular-shaped lifter pads provide a more effective means for providing buoyant force upon the SMD than conventional round lifter pads.

Yet another advantage of the present invention is that the rectangular lifter pads and optimized solder joints, along with the plugged vias in the alternate embodiment, act together to float the surface mount device to a desired solder joint height above the PCB mounting pads without detrimentally affecting fillet shape and overall crack propagation length.

These and other advantages, features and objects of the invention will become apparent from the drawings, detailed description, and claims which follow.

BRIEF DESCRIPTION OF THE DRAWINGS

FIGS. 1A–1E are longitudinal cross-section views of a portion of a surface mount device soldered to a printed circuit board, showing the successive phases of crack initiation, crack propagation, and solder joint failure.

DETAILED DESCRIPTION OF THE PREFERRED EMBODIMENTS

Figure 2:
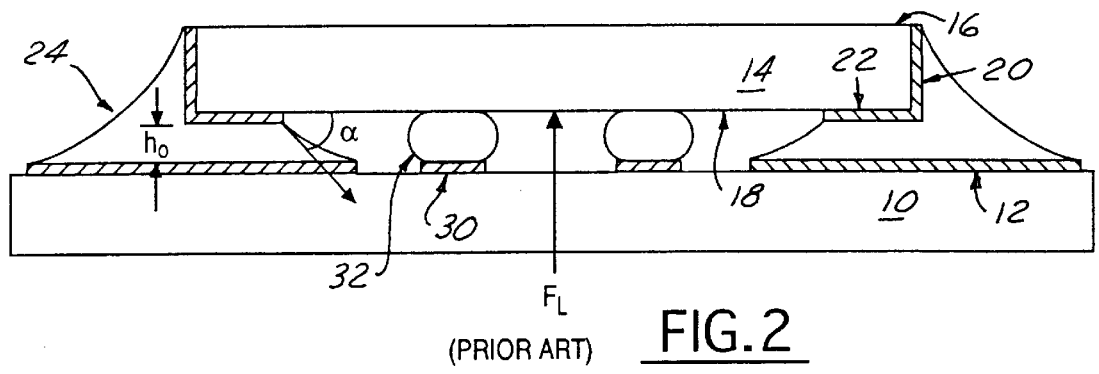
FIG. 2 is a longitudinal cross-section view of a surface mount device soldered to a printed circuit board according to the prior art, showing conventional solder joints with lifter pads.
Figure 3:
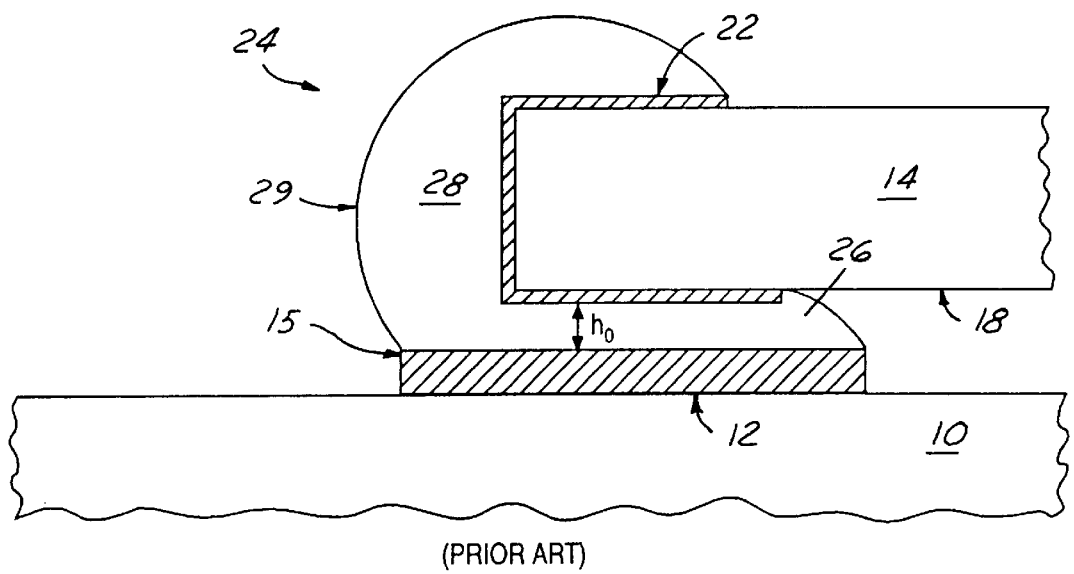
FIG. 3 shows a longitudinal cross-section view of a solder joint according to the prior art having convex fillets.
Figure 4:
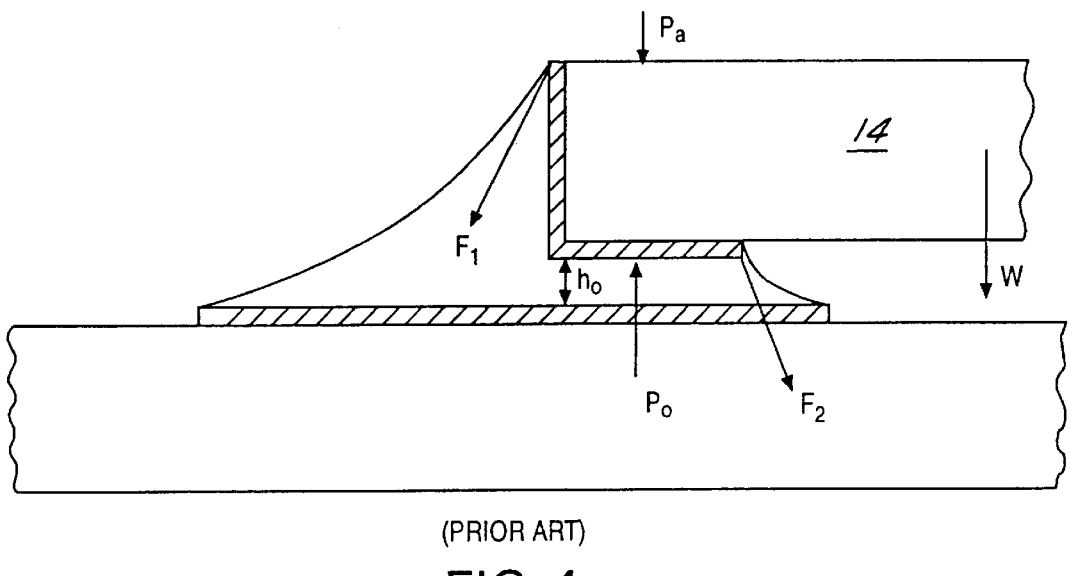
FIG. 4 shows a free body diagram of a solder joint according to the prior art having concave fillets.
Figure 5:
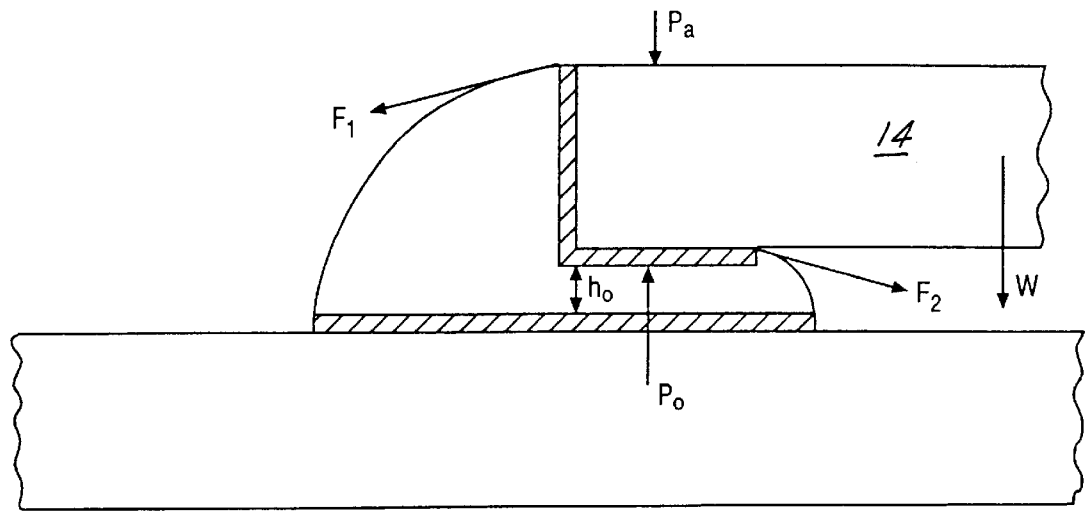
FIG. 5 shows a free body diagram of a solder joint according to the prior art having convex fillets.
Figure 6A:
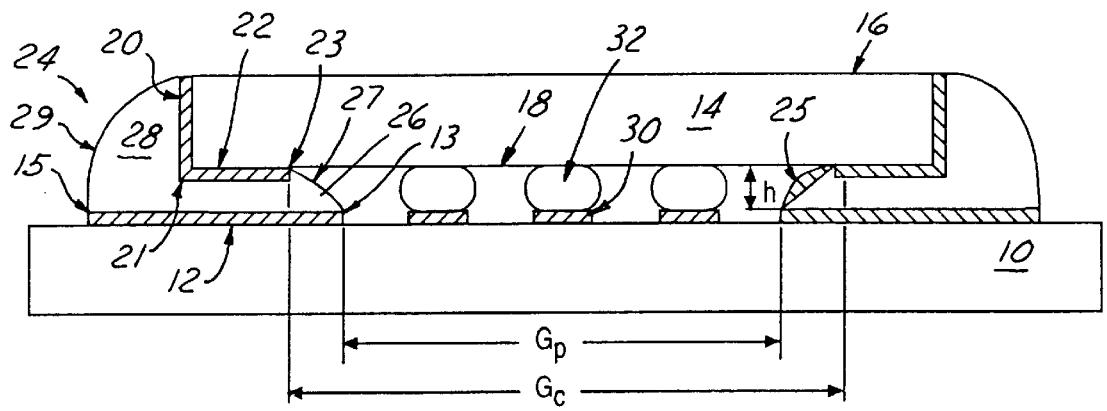
FIGS. 6A and 6B are longitudinal cross-section views of a surface mount device soldered to a printed circuit board according to the present invention, showing improved solder fillet shapes in conjunction with either optimized lifter pads or a plugged via/optimized lifter pad combination.

Referring now to the drawings, FIG. 6A shows a printed circuit board with an SMD mounted thereon with optimized solder joints according to a first embodiment of the present invention. This embodiment includes a PCB substrate 10 having a generally planar top surface, on which at least two mounting pads 12 are disposed. These mounting pads 12 are arranged on the top surface of the substrate 10 in matched relation with terminations 22 of an SMD 14. Also on this top surface are at least one lifter pad 30 for each SMD 14. The lifter pads 30 for each SMD 14 are arranged amid the corresponding mounting pads 12 for each respective SMD 14. Thus, each PCB has a substrate 10 with one group of mounting pads 12 and lifter pads 30 on its top surface for each individual SMD 14 mounted thereon.

The SMD 14 is a leadless surface mount device, such as a leadless ceramic chip resistor (LCCR) The device 14 has a generally rectangular top surface 16, a similarly shaped bottom surface 18 oriented substantially parallel to the top surface 16, and a perimeter wall 20 abutting the top and bottom surfaces 16/18 and running around the entire perimeter of the device 14. A bottom edge 21 is defined by the intersection of the bottom surface 18 with the perimeter wall 20. The SMD 14 also has terminations 22 on the bottom surface 18 adjacent the device's bottom edge 21, arranged in matched relation with the mounting pads 12 on the substrate 10. These terminations 22 may also extend up some or all of the perimeter wall 20, and also onto some portion of the top surface 16. The terminations 22 are electrically and mechanically connected to their respective mounting pads 12 by means of solder joints 24, each joint 24 consisting of a predetermined amount of solder.

Between each lifter pad 30 and the bottom surface 18 of the SMD 14 is a solder mass 32, consisting of a predetermined amount of solder. Each solder mass 32 is in contact with both its respective lifter pad 30 and the bottom surface 18 of the device 14.

The PCB according to the present invention is produced by first providing a PCB substrate 10 having at least two mounting pads 12 arranged on the top surface of the substrate 10 in matched relation with the terminations 22 of an SMD 14, and having at least one rectangular lifter pad 30 arranged on the surface amid the mounting pads 12. A predetermined amount of solder is applied to the mounting pads 12 and each lifter pad 30. This can be accomplished by screen printing or other conventional deposition means, usually according to a given overprinting strategy. After this step the SMD 14 is placed onto the mounting pads 12 with the terminations 22 in matched relation thereto. Next, the solder on the mounting pads 12 and lifter pads 30 is heated, such as by placing the entire PCB in a solder reflow oven. The heat will then melt the solder and the SMD 14 will float thereon above the mounting pads 12 due to the buoyant force provided by the molten solder. Finally, the molten solder is cooled, forming a solidified solder joint 24 atop each mounting pad 12 and a solidified solder mass 32 atop each lifter pad 30, such that the terminations 22 are situated at the desired solder joint height $h_o$ above the top surface of the mounting pads 12, the interior angle α is greater than a predetermined minimum angle, the outer fillet 28 is in contact with substantially the entire height of the perimeter wall 20, and the solder joint outer fillet 28 is preferably convex in shape. This creates a solder joint 24 which provides the desired solder joint height $h_o$ while also providing optimized solder joint structure which increases crack initiation and crack propagation times.

Figure 6B:
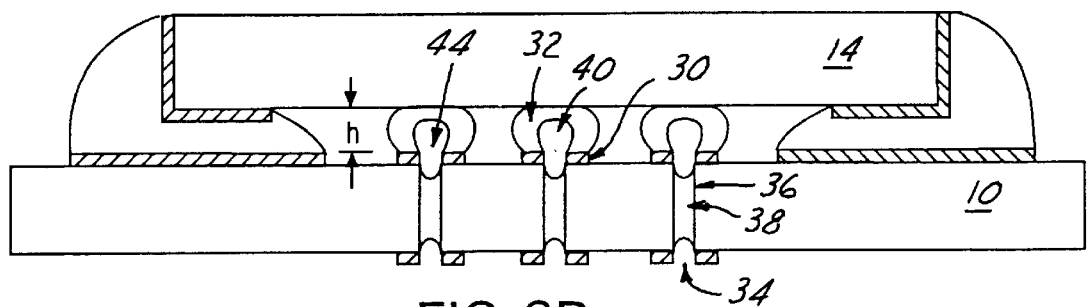
Figure 6C:
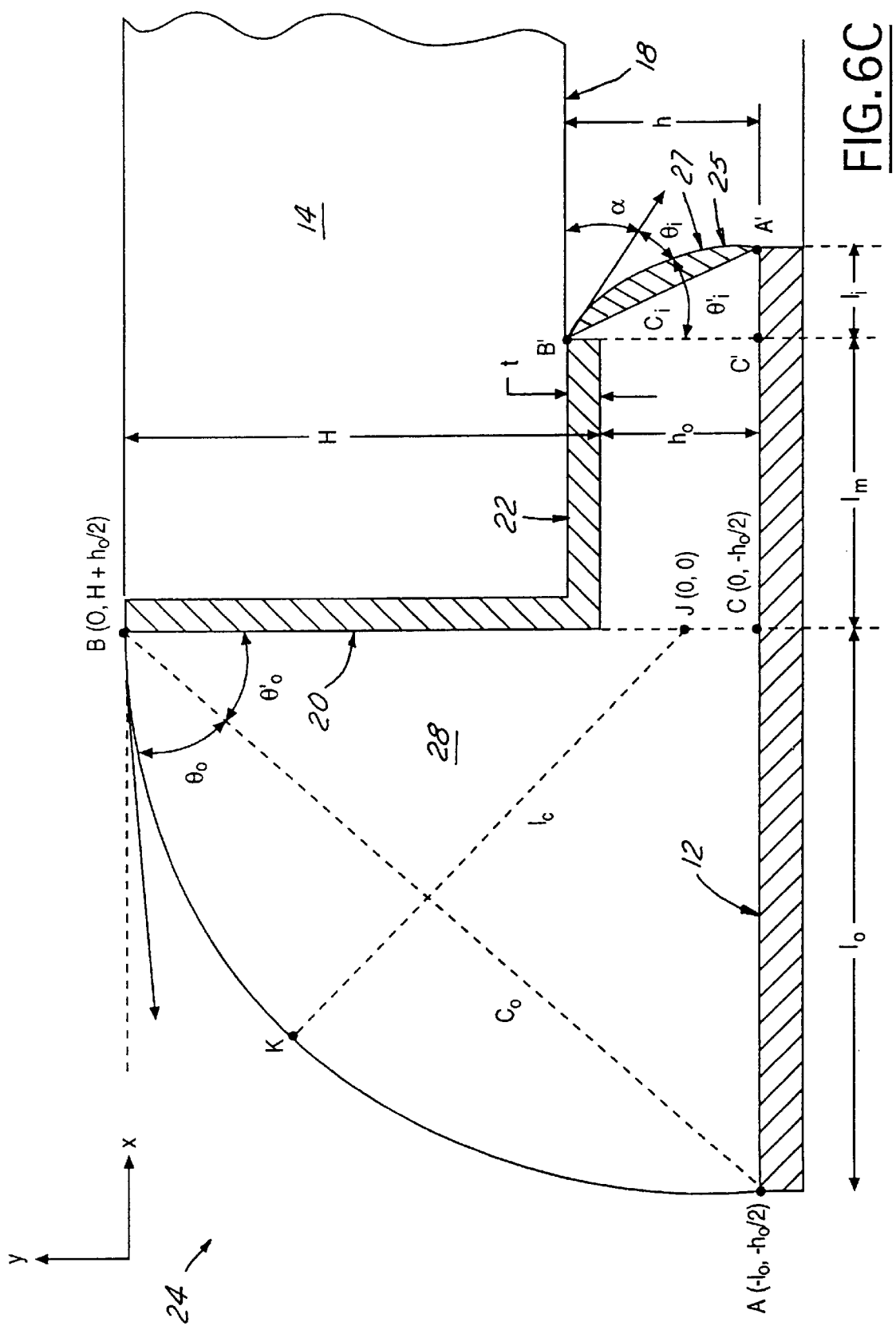
FIG. 6C is an enlarged cross-section view of a solder joint according to the present invention.

It should be noted that "optimized" solder joints, as used herein, refers to joints 24 having interior angles α greater than a predetermined minimum angle, outer fillets 28 contacting substantially the entire height of the device's perimeter wall 20, a maximum stage II crack propagation length $l_c$, and a solder volume $V_m$ sufficient to provide the desired solder joint height $h_o$, as illustrated in FIG. 6C. Thus, it is often (but not always) the case that the outer solder fillet 28 produced will be convex in shape. (It should be noted that when the outer fillet 28 is convex, so is the inner fillet 26, generally; likewise, when the outer fillet 28 is concave, so is the inner fillet 26.) However, there may be cases, such as when a very large solder joint height $h_o$ is sought or a particular solder formulation is used, that the desired $l_c$ crack propagation length and other characteristics may be optimized while nonetheless producing concave outer fillets. The inner and outer extensions $l_i/l_o$ and solder volume $V_M$ which promote these solder joint characteristics are thus also referred to as being "optimized". Also, "optimized" lifter pads, as used herein, refers to lifter pads 30 being rectangular (or, preferably, square) in shape, and having sufficient number, size, and solder mass volume $V_{LP}$ so as to provide the buoyant force necessary to maintain the desired solder joint height $h_o$. Similarly, the solder volume $V_{LP}$ calculated to promote this is referred to as being "optimized". Furthermore, "optimized" crack initiation and propagation times refer to the maximization of these times, as produced by the combination of the foregoing optimized features.

The procedure for designing the first embodiment of the present invention, as illustrated in FIGS. 6A and 6C, involves two general processes: (1) optimizing the solder joints 24 and mounting pads 12, and then (2) optimizing the solder masses 32 and lifter pads 30. Given as inputs into these two processes are: the dimensions and weight of the SMD 14, the solder paste material properties (e.g., percent solder), the desired solder joint height $h_o$ (e.g., 7 mils), the printing/overprinting strategy for solder deposition onto the mounting pads 12 and lifter pads 30 (e.g., 10 mil overprinting on three sides of each mounting pad), and the number and dimensions of lifter pads 30 (e.g., six per SMD). Using these inputs, the desired outputs from the two optimization processes will be: the optimum mounting pad inner extension li (i.e., the horizontal distance from the termination inner edge 23 to the mounting pad inner edge 13) which optimizes crack initiation time at the inner fillet 26, the optimum mounting pad outer extension $l_o$ (i.e., the horizontal distance from the SMD bottom edge 21 to the mounting pad outer edge 15) that optimizes crack propagation length $l_C$ in the outer fillet 28, and the volume of solder paste on each mounting pad $V_M$ and each lifter pad $V_{LP}$. Thus, given the provided inputs, the first process determines the geometric dimensions of the mounting pad 12 necessary to promote optimized crack initiation and propagation times, while the second process determines the solder mass volume necessary to float the device 14 (in conjunction with the buoyant force exerted by the solder joint 24) to the desired solder joint height $h_o$ and maintain the desired solder joint geometry.

Figure 8:
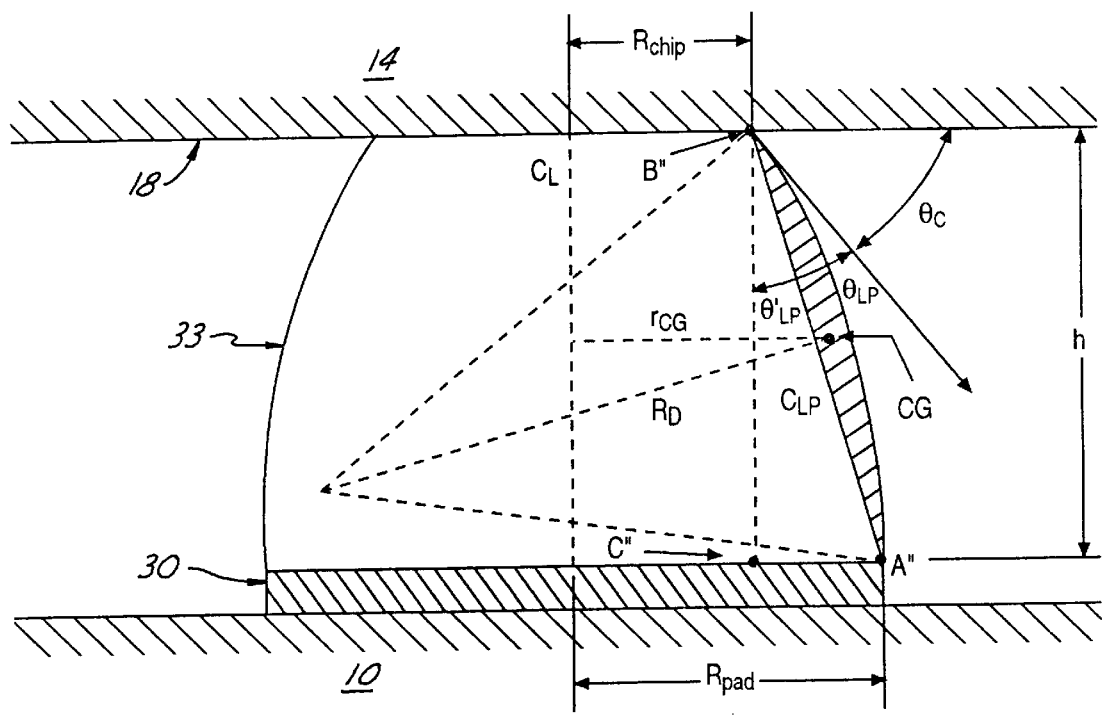
FIG. 8 shows an elevational view of a lifter pad and solder mass according to the present invention.

Each of these two optimizing processes will now be discussed in greater detail, using quantities from the following list of variables and constants:

$h_o$=desired solder joint height;

t=thickness of termination 22 on the bottom surface 18 of SMD 14;

h=height of solder joint at inner fillet 26 between top of mounting pad 12 and bottom surface 18;

H=height of solder on perimeter wall 20 measured from the bottom edge 21 (usually the same as the height of the SMD 14);

w=width of SMD 14 per solder joint 24;

W=weight of SMD 14 per pair of solder joints;

$V_{calc}$=calculated volume of solder on each mounting pad 12;

$V_M$=volume of solder on each mounting pad 12;

$V_{LP}$=volume of solder in each solder mass 32;

L=length of SMD 14;

$l_C$=crack propagation length in outer fillet 28, measured along line JK;

$l_o$=outward extension of mounting pad 12; (the horizontal distance from the bottom edge 21 to the mounting pad outer edge 15);

$l_m$=length of the bottom surface of termination 22;

$l_i$=inner extension of mounting pad 12 (the horizontal distance from the termination inner edge 23 to the mounting pad inner edge 13);

$G_p$=gap between mounting pads 12 on respective opposite edges of the device 14;

$G_c$=gap between termination inner edges 23 on respective opposite edges of the device 14;

$G_{c,max}$=maximum value of any $G_c$ measurements for a given device 14;

$A_{T,max}$=cross-sectional area of solder joint 24;

$A_{cs}$=cross-sectional area of solder mass circular segment 35, as shown in FIG. 8;

$C_o$=hypotenuse of triangle ABC in FIG. 6C;

$C_i$=hypotenuse of triangle A'B'C' in FIG. 6C;

$C_{LP}$=hypotenuse of triangle A"B"C" in FIG. 8;

$p_o$=pressure in the solder joint 24;

$p_a$=atmospheric (reference) pressure;

σ=surface tension;

F=downward force acting on a single lifter pad 30;

$F_o$=upward force acting on SMD 14 due to the solder joint 24;

N=number of lifter pads 30 for every outer pad;

$\theta_o$=angle between hypotenuse $C_o$ and the outer fillet's free surface 29;

$\theta_i$=angle between hypotenuse $C_i$ and the inner fillet's free surface 27;

$\theta_{LP}$=angle between hypotenuse $C_{LP}$ and the solder mass outer surface 33;

$\theta_o'$=angle between hypotenuse $C_o$ and the vertical;

$\theta_i'$=angle between hypotenuse $C_i$ and the vertical;

$\theta_{LP}'$=angle between hypotenuse CLP and the vertical;

$\theta_c$=angle between the solder mass free surface 33 and the bottom surface 18 of the SMD 14;

$\alpha$=angle between the inner fillet surface 27 and the bottom surface 18 of the SMD 14;

R=radius of curvature of outer fillet surface 27;

$R_{LP}$=radius of curvature of solder mass outer surface 33.

$R_{chip}$=the distance along the bottom surface 18 from the centerline of the solder mass 32 to the solder mass outer surface 33;

$R_{pad}$=the distance along the top of the lifter pad 30 from the centerline of the solder mass 32 to the solder mass outer surface 33;

$r_{CG}$=radial distance from centerline of solder mass 32 to centroid CG of solder mass circular segment 35;

J=point-of-origin located vertically halfway between bottom edge 21 and the top surface of mounting pad 12;

K=point of intersection between outer fillet surface 27, and a crack propagation line of length $l_c$ starting at point J and making a 45 degree angle with the perimeter wall 20;

$x_c$, $y_c$=x- and y-coordinates of point M, the origin of a circle which describes arc AKB; and C=temporary variable (defined below).

Optimizing the Solder Joints

The first step in optimizing the solder joints 24 is to design the inner fillet 26 such that the angle $\alpha$ between the fillet's free surface 27 and the bottom surface 18 of the device 14 is no smaller than about 30 degrees. This is accomplished by dimensioning the inner extension $l_i$ such that $$G_p \geq G_{c,max}\_3h \qquad (1)$$

giving $$l_i = (L - 2l_m - G_p)/2 \qquad (2)$$

Once the inner extension $l_i$ has been determined, the remaining steps of the solder joint optimization process focus on determining the outer extension $l_o$, given the volume of solder $V_m$ provided by the selected printing strategy, so as to form a preferably convex joint which achieves the desired solder joint height $h_o$ while optimizing the crack propagation length $l_c$ as measured along line JK.

The second step is to select a starting value for the mounting pad outer extension $l_o$. A starting value is needed because finding the optimum $l_o$ value is an iterative process. A suggested range is $0.5H < l_o < 2H$, so a starting value of $l_o = 0.75 H$ is recommended.

Third, the volume $V_{calc}$ of the solder joint 24 is determined by calculating the amount of solder which can be deposited given the selected $l_o$, the calculated $l_i$, the $l_m$ associated with the given SMD, the width of the solder joint w, and the particular printing or overprinting strategy to be used (e.g., 10 mil overprinting using a 10 mil thickness of solder paste having 50% solder by weight). This represents the amount of solder available during reflow to form the solder joint 24.

Using the anticipated geometric features of reflowed solder joint 24 as depicted in FIG. 6C, the volume $V_M$ of solder in the solder joint 24 can be expressed as:

$$V_M = w(l_o/2)(H + h_o) + w(l_i/2)h + l_m h_o + \qquad (3)$$
$$(w/4)\{C_o^2[\theta_o \csc^2\theta_o - \cot\theta_o] + C_i^2[\theta_i \csc^2\theta_i - \cot\theta_i]\}$$

with $$A_{T,max} = V_M / w, \qquad (4)$$

where $$C_o = \sqrt{l_o^2 + (H + h_o)^2} \qquad (5)$$

and $$C_i = \sqrt{l_i^2 + h^2} . \qquad (6)$$

In Eqn. 3, all the quantities are known except for $V_M$, $\theta_o$, and $\theta_i$. The angle $\theta_o$ can be determined (and the angle $\theta_i$ eliminated) by setting $V_M$ equal to $V_{calc}$ proceeding as follows.

Fourth, a temporary variable C is defined by ignoring the portion of Eqn. 3 corresponding to the miniscule volume of the inner fillet circular segment 25 (i.e., the $C_i^2[\theta_i \csc^2\theta_i - \cot\theta_i]$term), solving the equation in terms of the $[\theta_o \csc^2\theta_o - \cot\theta_c]$ binomial term, and setting the result equal to C:

$$C = [\theta_o \csc^2\theta_o - \cot\theta_o] = (4/C_o^2)[V_{calc/w} = (l_o/2) (H + h_o) - l_{ih}/2 - l_m h_o]. \qquad (7)$$

Fifth, the $\csc^2\theta_o$ term of Equation 7 is converted into $(\cot^2\theta_o + 1)$, yielding:

$$C = \theta_o \csc^2\theta_o - \cot\theta_o = \theta_o \cot^2\theta_o + \theta_o - \cot\theta_o. \qquad (8)$$

The cotangent terms of Eqn. 8 are then series expanded to include only the first three terms in the series, giving:

$$C = \theta_o(1/\theta_o - \theta_o/3 - \theta_o^3/45)^2 + \theta_o - (1/\theta_o - \theta_o/3 - \theta_o^3/45). \qquad (9)$$

Expanding the squared trinomial, ignoring the resulting higher-order terms, and combining like terms gives:

$$C = 2\theta_o/3 + 4\theta_o^3/45, \qquad (10)$$

or further, $$0 = \theta_o^3 + 15\theta_o/2 - 45C/4 \qquad (11)$$

Ignoring the third-order term in Eqn. 11, a first-order approximation of $\theta_o$ can be stated as:

$$\theta_o = 3C/2 \qquad (12)$$

wherein C can be determined using the latter part of Eqn. 7 above.

Once $\theta_o$ is determined, the sixth step is to calculate $\theta_o'$ using:

$$\theta_o' = \tan^{-1}[l_o/(H+h_o)] \qquad (13)$$

Seventh, a point $M(x_c, y_c)$ is defined as the center of a circle including arc AKB and having radius R; that is, point $M(x_c, y_c)$ is the center of curvature of the outer fillet free surface 29. $x_c$, $Y_c$, and R are calculated using:

$$R = C_o/(2\sin\theta_o), \qquad (14)$$

$$x_c = -l_o/2 + R\cos(\theta_o/2)\sin\theta_o' \qquad (15)$$

and $$y_c = H/2 - R\cos(\theta_o/2)\cos\theta_o' \qquad (16)$$

Eighth, the length $l_c$ of the outer extension is determined using:

$$l_c = \text{abs val} \frac{\left[(x_c - y_c) \pm \sqrt{2R^2 - (x_c + y_c)^2}\right]}{\sqrt{2}} \qquad (17)$$

Figure 7:
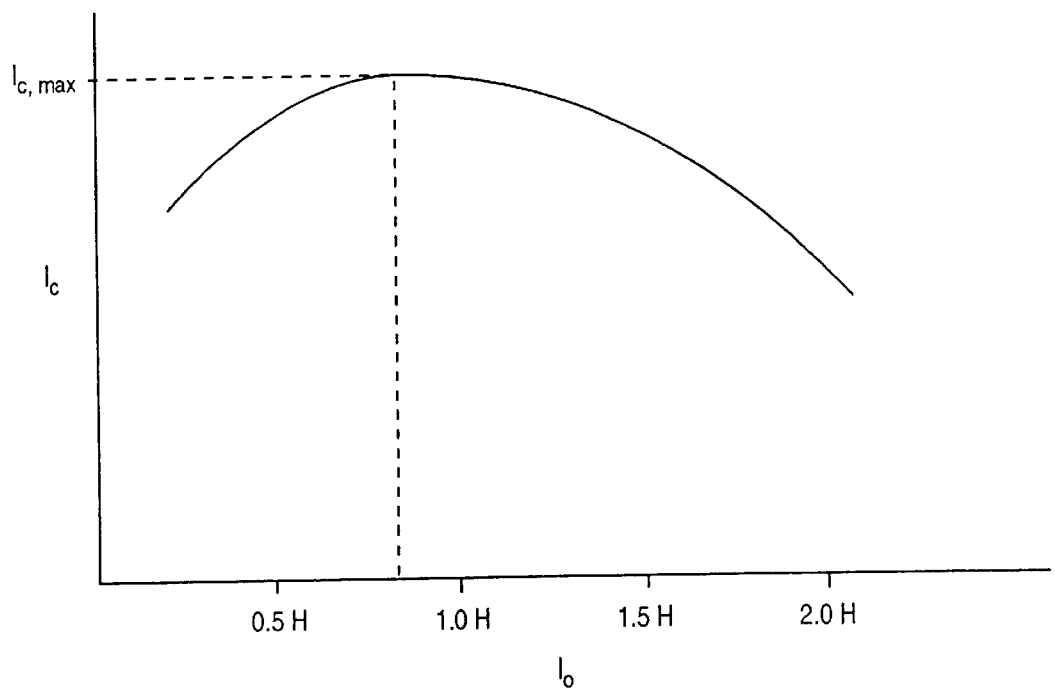
FIG. 7 shows a representative plot of $l_c$ versus $l_o$ within the range $0.5H<l_o<2H$.

The ninth and final step of the solder joint optimization process is to repeat the second through eighth steps above in order to plot $l_c$ versus $l_o$ within the range suggested in the first step (i.e., $0.5H < l_o < 2H$). FIG. 7 shows a representative plot of $l_c$ versus $l_o$ for the suggested range. Then, the value of $l_o$ is picked which corresponds to $l_{cmax}$, the maximum value of $l_c$. For example, in FIG. 7 the $l_o$ value of 0.83H corresponds to the maximum value of $l_c$.

Once the optimum inner extension $l_i$, optimum outer extension $l_o$, and solder joint volume $V_M$ are determined based on the given inputs, the lifter pads 30 and solder masses 32 can then be designed.

Optimizing the Lifter Pads

A critical aspect of lifter pad design is the ability to predict solder joint height $h_o$ given (1) the geometry of the device 14 and the mounting pads 12, (2) the number, shape, and size of the lifter pads 30, and (3) the solder volume $V_{LP}$ on each lifter pad 30. The geometry of the device 14 (i.e., $G_{c,max}$ and $l_m$) is determined by the particular device used in each case, while the mounting pad geometry (i.e., $l_o$ and $l_i$) is calculated in the above solder joint optimization process.

The number and size of the lifter pads 30 is somewhat affected by the method of solder deposition. For instance, in the conventional screen printing solder deposition method, the best consistency (i.e., minimum percent variation in solder volume) is usually obtained with stencil apertures between 12 and 26 mils. Since it is desirable to have many rather than fewer lifter pads (for improved standard deviation of deposited solder volume), a stencil aperture corresponding to the lower end of this range is recommended. Also, smaller pads are more effective for overprinting, and have less tendency to form solder balls than do larger pads. (That is, in depositing as much solder paste as possible without forming solder balls, a higher solder volume-to-lifter pad area ratio is possible with smaller pads than is with larger pads, generally.) Thus, the size and number of lifter pads 30 will depend on the available space underneath the component (i.e., $G_p$), the stencil aperture, the minimum recommended spacing between the stencil apertures, and the desired overprinting scheme. It has been found that a generally recommended number of lifter pads is three per solder joint, while the size $R_{pad}$ of the pads depends much more closely on the particular $G_p$, stencil/deposition characteristics, and overprinting strategy used.

As for the shape of the lifter pads 30, conventionally a circular shape is used. However, according to the present invention it is recommended that rectangular-shaped lifter pads be used. Rectangular, and preferably square, pads are more effective than circular ones for overprinting (i.e., deposition of excess solder) since the corners of the pad assist during solder "pullback" and wetting, but are not covered by the bulk of the solder mass 32 after reflow. For example, a square lifter pad 30 can be overprinted with solder 10 mils beyond each of the square's four edges, thus forming a square footprint of solder paste larger than and covering the square lifter pad. Then, during reflow, the solder paste will melt and the solder paste footprint will shrink to a roughly circular footprint as surface tension forces cause the solder mass 32 (and the SMD placed thereon) to rise, transforming the heretofore flat, square solder deposition into a roughly columnar mass atop the lifter pad 30 whose diameter straddles and is essentially equivalent to the width of the square pad.

As for the solder mass volume $V_{LP}$, an optimum solder volume is desirable since inadequate solder volume will result in low, perhaps concave fillets, while excessive solder quantities will raise the fillet heights inordinately and solder will be drawn under the component termination 22 from the bulk of the outer fillet 28, resulting in a shorter crack propagation length in the outer fillet 28. The steps given below provide the approximate design criteria to estimate the solder volume $V_{LP}$ required to achieve a desired solder joint height $h_o$ given the necessary geometric information. (It should be noted that while the following equations are for the case in which no metallizations corresponding to each lifter pad exist on the underside of the SMD, equations describing this case (e.g., for flip-chips) may be found in the literature.)

The first step toward determining $V_{LP}$ is to calculate the relative pressure in the solder joint 24 using:

$$(p_o - p_a) = (2\sigma\sin\theta_o)/C_o \qquad (18)$$

Second, the net upward force $F_o$ acting on the SMD 14 due to the solder joint 24 is calculated using:

$$F_o = w\{l_m[p_o - p_a - W/(2l_m w) - \sigma(\cos\theta_1 + \cos\theta_3)]\} \qquad (19)$$

where $$\theta_1 = \theta_o + \theta_o' \qquad (20)$$

and $$\theta_3 = \theta_i + \theta_i' \qquad (21)$$

Third, the downward force F acting on a single lifter pad 30 is calculated using:

$$F = -F_o/N, \qquad (22)$$

where N is the number of lifter pads 30 for every mounting pad 12.

The fourth step is to select a starting value for $\theta_{LP}$, the angle between hypotenuse $C_{LP}$ and the solder mass outer surface 33, as shown in FIG. 8. A suggested range is 10°<θ$_{LP}$<40°, so a starting value of θ$_{LP}$=25° is recommended.

Fifth, R$_{chip}$, C$_{LP}$, and R$_{LP}$ are calculated using:

$$R_{chip} = R_{pad} - h\cot(\theta_{LP} + \theta_c), \quad (23)$$

$$C_{LP} = h\sqrt{1 + \cot^2(\theta_{LP} + \theta_c)} = h/[\sin(\theta_{LP} + \theta_c)], \quad (24)$$

and $$R_{LP} = -C_{LP}/(2\sin\theta_{LP}) = -h/[2\sin\theta_{LP}\sin(\theta_{LP} + \theta_c)], \quad (25)$$

where θ$_c$ is an interface angle determined by the physical characteristics of the solder and the bottom surface 18 in contact with each other, as can be determined by one having skill in the art.

Sixth, the force on an individual lifter pad 30 is calculated using:

$$F'=\pi\sigma R_{chip}^2/R_o - 2\pi R_{chip}\sigma\sin(\theta_{LP}+\theta_c) \quad (26)$$

where $$R_o=-R_{LP} \quad (27)$$

Seventh, the fourth through sixth steps are iterated until a value for θ$_{LP}$ is arrived at such that the value of F' equals the value of F calculated in the third step (Eqn. 22) above.

Eighth, A$_{CS}$ and r$_{CG}$ are calculated using:

$$A_{CS}=\tfrac{1}{2}(R_o^2)(2\theta_{LP}-\sin 2\theta_{LP}) \quad (28)$$

and $$r_{CG}=(R_{chip}+R_{pad})/2+R_o[(4\sin 3\theta_{LP})/(6\theta_{LP}-3\sin 2\theta_{LP})-\cos\theta_{LP}]\sin(\theta_{LP}+\theta_c) \quad (29)$$

The ninth and final step is to calculate the volume V$_{LP}$ of each lifter pad solder mass 32 using:

$$V_{LP}=\pi[hR_{chip}^2+h(R_{pad}-R_{chip})(2R_{chip}+R_{pad})/3+2A_{CS}r_{CG}] \quad (30)$$

Once the solder joint optimization and lifter pad optimization processes are completed, the inner extension l$_i$, outer extension l$_o$, and solder volumes V$_M$/V$_{LP}$ can be used with the given input information to construct the foregoing first embodiment.

A second embodiment of the present invention is shown in FIG. 6B. This embodiment is similar to the first, with the addition of plugged vias 34 and gas pockets 40 filled with gas 42 which assist the lifter pads 30 and solder masses 32 in providing additional upward force F$_L$ against the SMD 14. The plugged via 34 consists of a via hole 36 formed through the substrate 10, with the hole 36 being at least partially filled with a plug material 38. Also, the lifter pads 30 have a hole 44 formed therethrough in this embodiment, the hole 44 thus defining an interior wall of the lifter pad 30. A pocket 40 is formed at the top of the plugged via 34, generally bounded on its top by the solder mass 32, on its sides by the solder mass 32 and/or interior wail of the lifter pad 30 and/or via hole 36, and on its bottom by the plug material 38. It is also possible to fill the via hole 36 entirely with plug material 38, so long as some amount of pocket 40 is formed; however, preferably the via 36 is only partially filled with plug material 38, so that a larger pocket 40 is formed and thereby permitting greater lift from the subsequent expansion of gas 42 trapped in the pocket 40.

The plugged vias 34 are designed to trap gas 42 during reflow, and provide gas expansion that tends to increase the solder mass height h beneficially while reducing the solder deposition quantity required for the given increase in solder joint height h$_o$. The gas 42 may consist of air or other ambient gas trapped in the pocket 40 when the solder mass 32 is deposited atop the lifter pads 30, as well as volatile gases released internally by the solder mass 32 during the high heat of reflow.

Various other modifications to the present invention will, no doubt, occur to those skilled in the art to which the present invention pertains. For example, it is also possible to provide plugged vias 34 under the mounting pads 12 in addition to or instead of the plugged vias 34 underneath the lifter pads 30. Also, it is clear that the solder joints 24 and solder masses 32 may be composed of the same solder or solder paste. It is the following claims, including all equivalents, which define the scope of the invention.

What is claimed is:

1. A printed circuit board, comprising:
   a printed circuit board substrate;
   at least one surface mount device having a bottom surface and a bottom edge about said surface, said device having terminations on said bottom surface adjacent said bottom edge;
   at least two mounting pads for each of said surface mount devices, said mounting pads being disposed on a top surface of said substrate in matched relation with said terminations of said surface mount device;
   a solder joint connecting each of said terminations with its respective mounting pad, each solder joint having inner and outer fillets and comprising a first predetermined amount of solder;
   at least one lifter pad for each surface mount device, each lifter pad being disposed on said top surface of said substrate amid said mounting pads; and
   a solder mass for each lifter pad, wherein each solder mass is disposed between and in contact with its respective lifter pad and said bottom surface of said surface mount device, each solder mass comprising a second predetermined amount of solder;
   wherein said first and second predetermined amounts of solder on said mounting pads and each lifter pad in a molten state provide a net buoyant force on said surface mount device such that said device rises to a predetermined height above said mounting pads, and wherein said solder in a solidified state maintains said device at substantially said predetermined height above said mounting pads;
   wherein said substrate further includes vias formed therethrough and each lifter pad includes a lifter pad hole formed therethrough, each of said vias being aligned with a respective lifter pad hole, said vias being partially plugged with a plug material, thereby defining a closed pocket between each solder mass and said plug material where gas may be trapped and allowed to expand during reflow.

2. A printed circuit board according to claim 1, wherein an inner extension of each mounting pad is of a predetermined length so as to promote an angle between said bottom surface of said surface mount device and a free surface of said inner fillet to be at least as great as a predetermined minimum angle.

3. A printed circuit board according to claim 2, wherein said predetermined minimum angle is 30 degrees.

4. A printed circuit board according to claim 1, wherein said outer fillet contacts substantially the entire height of a perimeter wall of said surface mount device without substantially extending onto a top surface of said device, thereby providing increased crack propagation length.

5. A printed circuit board according to claim 1, wherein said outer fillet of said solder joint convex in shape.

6. A printed circuit board according to claim 1, wherein an outer extension of each mounting pad is of a predetermined length so as to maximize crack propagation length in said outer fillet, said predetermined length being based on a preselected solder deposition strategy.

7. A printed circuit board according to claim 1, wherein each lifter pad is rectangular in shape.

8. A printed circuit board according to claim 1, wherein each lifter pad is square in shape.

9. A printed circuit board according to claim 1, wherein each surface mount device has three lifter pads per solder joint.

10. A printed circuit board according to claim 1, wherein said solder joints and each solder mass are composed of the same solder material.

11. A printed circuit board according to claim 1, wherein said plug material is thermally conductive.

12. A printed circuit board according to claim 1, wherein said substrate further includes additional vias formed therethrough and said mounting pads include mounting pad holes formed therethrough, said additional vias being aligned with said mounting pad holes, said additional vias being partially plugged with a plug material, thereby defining a closed pocket between said solder joint and said plug material where gas may be trapped and allowed to expand during reflow.

13. A printed circuit board, comprising:

a printed circuit board substrate;

at least one surface mount device having a bottom surface and a bottom edge about said surface, said device having terminations on said bottom surface adjacent said bottom edge;

at least two mounting pads for each of said surface mount devices, said mounting pads being disposed on a top surface of said substrate in matched relation with said terminations of said surface mount device;

a solder joint connecting each of said terminations with its respective mounting pad, said solder joint having convex inner and outer fillets and sisting of a predetermined amount of solder, whe in said convex outer fillet contacts subsantially the entire height of a perimeter wall said surface mount device;

at least one square lifter pad for each of said surface mount devices, each lifter pad being disposed on said top surface of said substrate amid said mounting pads; and a solder mass for each lifter pad, each solder mass being disposed between and in contact with its respective lifter pad and said bottom surface of said surface mount device, each solder mass consisting of a predetermined amount of solder;

wherein said predetermined amounts of solder on said mounting pads and each lifter pad in a molten state provide a net upward force on said surface mount device such that said device rises to a predetermined height above said mounting pads, and wherein said solder in a solidified state maintains said device at substantially said predetermined height above said mounting pads, and wherein an inner extension of each mounting pad is of a predetermined length so as to promote an angle between said bottom surface of said surface mount device and a free surface of said inner fillet to be at least 30 degrees, and wherein an outer extension of each mounting pad is of a predetermined length so as to maximize crack propagation length in said outer fillet, said predetermined length being based on a preselected solder deposition strategy.

14. A printed circuit board, comprising:

a printed circuit board substrate;

at least one surface mount device having a bottom surface and a bottom edge about said surface, said device having terminations on said bottom surface adjacent said bottom edge;

at least two mounting pads for each of said surface mount devices, said mounting pads being disposed on a top surface of said substrate in matched relation with said terminations of said surface mount device;

a solder joint connecting each of said terminations with its respective mounting pad, each solder joint having inner and outer fillets and comprising a first predetermined amount of solder;

at least one lifter pad for each surface mount device, each lifter pad being disposed on said top surface of said substrate amid said mounting pads; and a solder mass for each lifter pad, wherein each solder mass is disposed between and in contact with its respective lifter pad and said bottom surface of said surface mount device, each solder mass comprising a second predete rmin ed amount of solder;

wherein said first and second predetermined amounts of solder on said mounting pads and each lifter pad in a molten state provide a net buoyant force on said surface mount device such that said device rises to a predetermined height above said mounting pads, and wherein said solder in a solidified state maintains said device at substantially said predetermined height above said mounting pads;

wherein said device has a height H and wherein an outer extension of each mounting pad extends outward from said device between and including 0.7H and 1.4H.

15. A printed circuit board according to claim 14, wherein said outer fillet of said solder joint is convex in shape.

16. A printed circuit board, comprising:

a printed circuit board substrate;

at least one surface mount device having a bottom surface and a bottom edge about said surface, said device having terminations on said bottom surface adjacent said bottom edge;

at least two mounting pads for each of said surface mount devices, said mounting pads being disposed on a top surface of said substrate in matched relation with said terminations of said surface mount device;

a solder joint connecting each of said terminations with its respective mounting pad, each solder joint having convex inner and outer fillets and comprising a first predetermined amount of solder;

at least one lifter pad for each surface mount device, each lifter pad being disposed on said top surface of said substrate amid said mounting pads; and a solder mass for each lifter pad, wherein each solder mass is disposed between and in contact with its respective lifter pad and said bottom surface of said surface mount device, each solder mass comprising a second predetermined amount of solder;

wherein said first and second predetermined amounts of solder on said mounting pads and each lifter pad in a molten state provide a net buoyant force on said surface mount device such that said device rises to a predetermined height above said mounting pads, and wherein said solder in a solidified state maintains said device at substantially said predetermined height above said mounting pads;

wherein said device has a height H and wherein an outer extension of each mounting pad extends outward from said device between and inclduing 0.7H and 1.4H.

17. A printed circuit board, comprising:

a printed circuit board substrate;

at least one surface mount device having a bottom surface and a bottom edge about said surface, said device having terminations on said bottom surface adjacent said bottom edge, wherein said terminations are spaced apart from each other by a distance $G_c$;

at least two mounting pads for each of said surface mount devices, said mounting pads being disposed on a top surface of said substrate in matched relation with said terminations of said surface mount device, wherein said mounting pads are spaced apart from each other by a distance $G_p$;

a solder joint connecting each of said terminations with its respective mounting pad, each solder joint having inner and outer fillets and comprising a first predetermined amount of solder;

at least one lifter pad for each surface mount device, each lifter pad being disposed on said top surface of said substrate amid said mounting pads; and a solder mass for each lifter pad, wherein each solder mass is disposed between and in contact with its respective lifter pad and said bottom surface of said surface mount device, each solder mass comprising a second predetermined amount of solder;

wherein said first and second predetermined amounts of solder on said mounting pads and each lifter pad in a molten state provide a net buoyant force on said surface mount device such that said device rises to a predetermined height h above said mounting pads, and wherein said solder in a solidified state maintains said device at substantially said predetermined height h above said mounting pads;

wherein said device has a height H and wherein an outer extension of each mounting pad extends outward from said device between and including 0.7H and 1.4H; and wherein $G_p \geq G_c - 3h$.

18. A printed circuit board according to claim 17, wherein said outer fillet of said solder joint is convex in shape.

19. A printed circuit board, comprising:

a printed circuit board substrate;

at least one surface mount device having a bottom surface and a bottom edge about said surface, said device having terminations on said bottom surface adjacent said bottom edge, wherein said terminations are spaced apart from each other by a distance Gc;

at least two mounting pads for each of said surface mount devices, said mounting pads being disposed on a top surface of said substrate in matched relation with said terminations of said surface mount device, wherein said mounting pads are spaced apart from each other by a distance Gp;

a solder joint connecting each of said terminations with its respective mounting pad, each solder joint having convex inner and outer fillets and comprising a first predetermined amount of solder;

at least one lifter pad for each surface mount device, each lifter pad being disposed on said top surface of said substrate amid said mounting pads; and a solder mass for each lifter pad, wherein each solder mass is disposed between and in contact with its respective lifter pad and said bottom surface of said surface mount device, each solder mass comprising a second predetermined amount of solder;

wherein said first and second predetermined amounts of solder on said mounting pads and each lifter pad in a molten state provide a net buoyant force on said surface mount device such that said device rises to a predetermined height h above said mounting pads, and wherein said solder in a solidified state maintains said device at substantially said predetermined height h above said mounting pads;

wherein $Gp \geq Gc3h$.

20. A printed circuit board, comprising:

a printed circuit board substrate;

at least one surface mount device having a bottom surface and a bottom edge about said surface, said device having terminations on said bottom surface adjacent said bottom edge;

at least two mounting pads for each of said surface mount devices, said mounting pads being disposed on a top surface of said substrate in matched relation with said terminations of said surface mount device;

a solder joint connecting each of said terminations with its respective mounting pad, each solder joint having inner and outer fillets and comprising a first predetermined amount of solder;

at least one lifter pad for each surface mount device, each lifter pad being disposed on said top surface of said substrate amid said mounting pads; and a solder mass for each lifter pad, wherein each solder mass is disposed between and in contact with its respective lifter pad and said bottom surface of said surface mount device, each solder mass comprising a second predetermined amount of solder;

wherein said first and second predetermined amounts of solder on said mounting pads and each lifter pad in a molten state provide a net buoyant force on said surface mount device such that said device rises to a predetermined height above said mounting pads, and wherein said solder in a solidified state maintains said device at substantially said predetermined height above said mounting pads;

wherein said device has a height H;

wherein each solder joint has an outer fillet surface and first and second reference points, said first reference point being defined as a point where said outer fillet surface contacts said termination, said second reference point being defined as a point on said mounting pad directly beneath said first reference point; and wherein the distance from said second reference point to said outer fillet surface along an upward 45° line is at least 9/11 H.

21. A printed circuit board according to claim 20, wherein said outer fillet of said solder joint is convex in shape.

* * * * *